(12) United States Patent
Kerl

(10) Patent No.: US 6,950,350 B1
(45) Date of Patent: Sep. 27, 2005

(54) CONFIGURABLE PIPE DELAY WITH WINDOW OVERLAP FOR DDR RECEIVE DATA

(75) Inventor: Daniel L. Kerl, Huntsville, AL (US)

(73) Assignee: #Dlabs, Inc., Ltd., Reid Hall Hamilton (BM)

(*) Notice: Subject to any disclaimer, the term of this patent is extended or adjusted under 35 U.S.C. 154(b) by 694 days.

(21) Appl. No.: 10/117,663

(22) Filed: Apr. 4, 2002

Related U.S. Application Data

(60) Provisional application No. 60/346,518, filed on Jan. 8, 2002.

(51) Int. Cl.[7] .................................................. G11C 7/00
(52) U.S. Cl. ................... 365/193; 365/194; 365/233.5; 365/189.05
(58) Field of Search ............................ 365/193, 194, 365/233.5, 189.05

(56) References Cited

U.S. PATENT DOCUMENTS

| | | | |
|---|---|---|---|
| 5,920,511 A | 7/1999 | Lee et al. ............... | 365/189.05 |
| 6,016,283 A * | 1/2000 | Jeong ................... | 365/189.05 |
| 6,044,032 A * | 3/2000 | Li ........................ | 365/230.03 |
| 6,060,916 A | 5/2000 | Park ..................... | 327/99 |
| 6,061,292 A | 5/2000 | Gray et al. ............ | 365/230.06 |
| 6,134,182 A | 10/2000 | Pilo et al. .............. | 365/233 |
| 6,154,419 A * | 11/2000 | Shakkarwar .......... | 365/235 |
| 6,279,073 B1 * | 8/2001 | McCracken et al. .. | 711/105 |
| 6,381,194 B2 * | 4/2002 | Li .......................... | 365/233 |

* cited by examiner

*Primary Examiner*—Van Thu Nguyen
*Assistant Examiner*—Tuan T. Nguyen
(74) *Attorney, Agent, or Firm*—Carlton Fields, P.A.; Li K. Wang, Esq

(57) ABSTRACT

A system for maximizing set up and hold times for data reads from a DDR memory device. The system adjusts timing of a strobe from a DDR memory device and converts data from the DDR memory device into a single-data-rate data. The timing adjustment is preferably controlled through software, and the system selectively determines if an extra half cycle should be added to the data path to optimize data reads.

16 Claims, 3 Drawing Sheets

CONFIGURABLE PIPE DELAY WITH WINDOW OVERLAP FOR DDR RECEIVE DATA

CROSS REFERENCE TO RELATED APPLICATION

This application claims the benefit of U.S. Provisional Patent Application Ser. No. 60/346,518, titled Configurable Pipe Delay Window Overlap for DDR Receive Data filed on Jan. 8, 2002.

BACKGROUND OF THE INVENTION

1. Field of the Invention

The present invention generally relates to computer systems. More specifically, the present invention relates to a computer circuit for maximizing set up and hold time for data received from a double-data-rate synchronous memory device.

2. Description of the Related Art

Speed has always been an important factor in measuring the performance of a computer system, and speed depends, among other factors, how fast can data be retrieved from data registers for the central processing unit (CPU)'s use and how fast can data be stored into the data registers after CPU's calculation.

Data are stored into the data registers or memory locations with help of a strobe signal. The data can be latched to their location by either the rising edge or the falling edge of the strobe signal. To achieve a high data rate Double-Data-Rate Synchronous Dynamic Random Access Memory (DDR-SDRAM or DDR) has been used. DDR differs from standard DRAM (or SDRAM) in that it uses a separate strobe signal by which some or all of its data timing is referenced and both the rising and the falling edges of the strobe signal are used to clock data into their destination. Thus, doubling the amount of data transferred in a given time interval. This technique also allows higher data rates than standard single-data-rate SDRAM because the explicit strobe signal by which data is referenced can be used to remove some of the timing uncertainty present in the receive path.

However, DDR-SDRAM presents challenges when interfacing to high-speed synchronous systems, and the challenges are related to data interface. The two different timing challenges are: (1) Aligning each strobe edge such that setup and hold timing margins at the receiving data latches are maximized. If the setup and hold timing margins are insufficient, the data retrieved or stored may not be accurate. The alignment of strobe edge is complicated by the fact that clock speeds have increased and the uncertainties associated with DDR-SDRAM read data timing have not scaled accordingly. For a clock period of 4 nanoseconds, a memory device may require one nanosecond setup time and one nanosecond hold time, thus yielding a two nanoseconds data window for the memory device. As the clock speed increases, the memory devices' requirement for time to read and write data has not relented. For a 1.5 nanosecond clock period, a memory device may require half nanosecond set up time and half nanosecond for hold time, thus leaving only a half nanosecond data window for the memory device. This has resulted in a disproportionate shrinkage of the valid data window, requiring more precise control of strobe timing positioning on its data; and (2) presenting the received data to its destination latch with no cycle-to-cycle ambiguity. At high clock speeds where timing uncertainty approaches an entire clock cycle, the cycle-to-cycle match is difficult.

Presenting the received data (read timing) is especially troublesome because a significant delay usually exists from the time that the system transitions the clock to a DDR part to the time that the data and its accompanying strobe edge arrive back at the system. The timing uncertainty in this path is usually large, in some cases as large as a DDR clock cycle. In most system designs, the received data must be presented to logic that is synchronous with the DDR clock.

Timing uncertainty may also be affected by environmental factors such as operating temperature and operating voltage. A clock period may change slightly from when the system is first booted to when the system reaches its operating temperature. Further, a change in operating voltage may also affect when a signal becomes active.

It would be advantageous for a system including a DDR-SDRAM to minimize timing uncertainty that can lead to ambiguity as to when a particular datum is available from a DDR-SDRAM, as well as minimize other timing-related problems such as setup and hold timing violations on clock-synchronous registers that follow registers clocked by the received strobes. It is to such a system and method the present invention is primarily directed.

SUMMARY OF THE INVENTION

The present invention discloses a system and method that uses a combination of hardware and software to reduce timing uncertainty in the receive path. The system uses software to control a combination of a strobe timing adjustment circuit and a single datum to double data converting circuit, where each of these circuit include a plurality of latches and control signals. The system allows software to control both the timing of each edge of the strobe that clocks the data receive latches, and the insertion of a half-clock cycle delay into the data path downstream from the data receive latches.

Software optimizes the setting of a programmable delay unit in the strobe timing adjustment circuit via a series of read/write operations, in which the software gathers statistics on the success or failure of DDR reads while varying the timing of the strobe. The programmable delay unit is set when software determines an optimal result from the read/write operations has been reached. This allows most data receive timing uncertainty to be tuned out.

The system can schedule these read/write operations when the system is first booted and repeat them as necessary when the system's operating condition changes. The software allows the system to adjust the timing of the strobe as the operating condition changes.

The system according to the present invention also allows insertion of a half timing cycle delay in the data path to avoid set up and hold timing violations for latched data being presented for reclocking to the 2X clock domain. An additional circuit is added in the data path to enable the system to add a half cycle delay in the data path, if the extra timing is needed to avoid setup and hold timing violations. The addition of half cycle delay is controlled by the software. Similarly to the setting of the programmable delay unit, the system can also perform read/write operations to decide whether extra timing cycle is needed.

Other objects, features, and advantages of the present invention will become apparent after review of the hereinafter set forth Brief Description of the Drawings, Detailed Description of the Invention, and claims appended herewith.

DETAIL DESCRIPTION OF THE INVENTION

For DDR read operations, a DDR-SDRAM launches data and the accompanying strobe at the same time, i.e., the data from the DDR-SDRAM is put onto a data bus at the same time that the DDR-SDRAM enables the strobe. The strobe from the DDR-SDRAM is generally delayed to ensure that the data is stable before being latched, so that the setup and hold times are satisfied for the receiving data latches.

Figure 1:
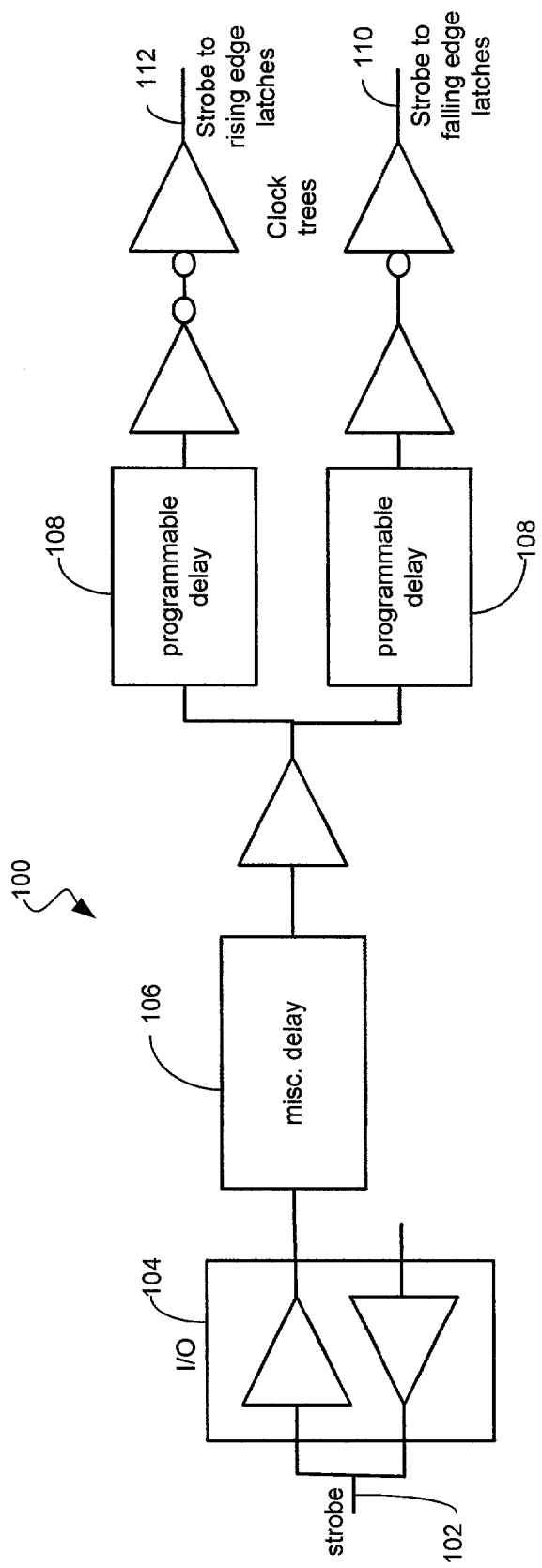
FIG. 1 illustrates a circuit for adjusting strobe timing according to one embodiment of the present invention.

Referring now in more detail to the drawings in which like numerals refer to like parts throughout the several figures, FIG. 1 illustrates a strobe timing adjustment circuit 100 for adjusting the strobe timing. The circuit 100 takes one strobe from the DDR-SDRAM and generates two new strobes with independent adjustments, one for the rising edge latches and one for the falling edge latches. The circuit 100 generates two strobes because these strobes are used in a circuit shown in FIG. 2, where a 1-bit data stream is converted to a 2-bit data stream. DDR-SDRAM always presents two data per clock, so it is necessary to provide latches for both strobe edges if the DDR is to be fully utilized in both capacity and bandwidth.

The circuit 100 receives one strobe 102, from a DDR-SDRAM part, through a bi-directional input/output (I/O) buffer 104. The strobe 102 passes through different elements, which have a combined delay represented by box 106. The strobe then divides into two signals going through two separate programmable delays 108. One signal is inverted to become a strobe for falling edge latches 110, while the other signal is used as a strobe for rising edge latches 112.

The programmable delay 108 is controlled by software and the length of the delay is adjustable. The timing of a strobe can be affected by different delays in a system such as one illustrated in FIG. 1, at box 106. However, the delay represented by box 106 varies with external factors such as operating temperature or voltage. The programmable delay 108 helps the circuit 100 to adjust the delay, so the setup and hold time at the receiving latches can be maximized.

The programmable delay 108 is settable to an optimal duration through read/write operations. The system writes a known pattern into the DDR-SDRAM and reads it back. If the data read back matches the known pattern, it means that the strobe timing does not violate the set up and hold times requirements. If the data read back do not match the known pattern, it means that the setup or hold timing requirements are violated by the strobe timing. The system then adjusts the strobe timing by increasing or reducing the programmable delay duration. After adjusting the programmable delay 108, the system repeats the read/write operation until an optimal delay is found. The optimal delay would maximize the set up and hold timing at the receive latches.

After a proper delay is introduced by the programmable delay 108, two strobes are generated: one strobe 112 for rising edge latches and other strobe 110 for falling edge latches. These two strobes are used in a data circuit 200 illustrated in FIG. 2, where two bits of DDR-SDRAM per wire is converted to a single data rate (SDR) data on two wires in parallel.

Figure 2:
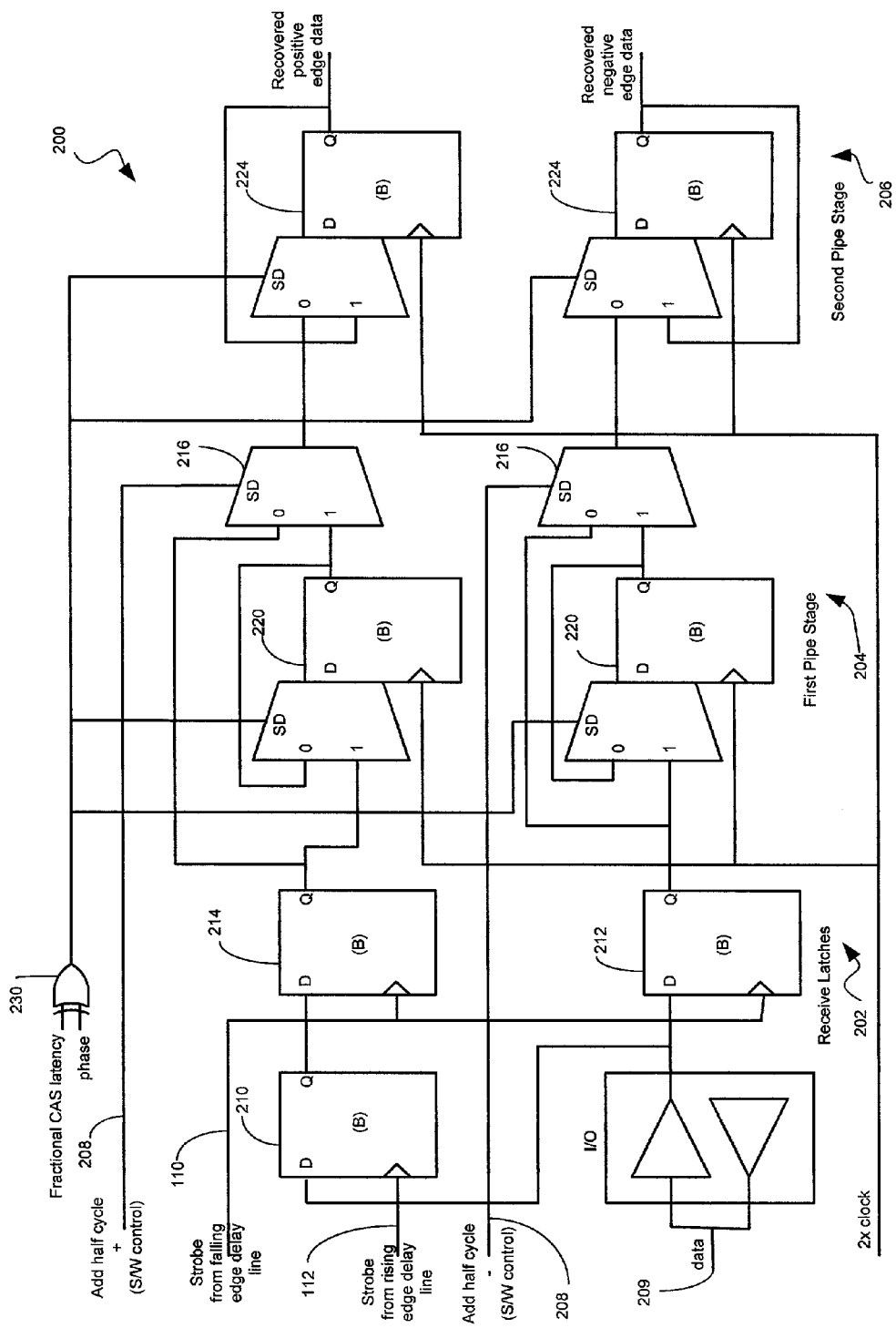
FIG. 2 illustrates a circuit for converting a single datum stream into a double data stream and optionally adding an extra half timing cycle into the data path according to one embodiment of the present invention.

When data from the DDR-SDRAM becomes available at the output of the receive latches, it is synchronized to the clock signal that was originally issued to the DDR-SDRAM. However, over a wide range of possible clock frequencies, the specific clock cycle in which receive latch data becomes available is ambiguous. FIG. 2 eliminates this ambiguity by employing two reclock pipe stages, each pipe stage driven by a 2X clock. Using multiplexers and a delayed 1X clock, which functions as a phase variable, two overlapping data windows are created by the circuit of FIG. 2 and the windows are sampled. The overlapping data windows allow potential setup or hold timing violations at the pipe stages to be avoided. As with the strobe delay adjustment, software selects a window based upon the results of experimentation by controlling the "add half cycle" signal that controls multiplexers present in the data path.

Although FIG. 2 illustrates a single-datum-to-double-data converting circuit for converting two bits of DDR data per wire to a SDR data on two wires in parallel, those skilled in the art would appreciate the circuit can be easily expanded to convert any size of DDR data, including 32-bit data, from a DDR-SDRAM. This data circuit 200 is divided into three stages: a receive stage 202, a first pipe stage 204, and a second pipe stage 206. Future increases in clock rates may well require additional overlapping timing windows; this can be accommodated by adding additional bypassable pipe stages. Adding bypass multiplexers 216 and a third pipe stage with multiplexer latches, which are phased so the multiplexer latches change state when the multiplexer latches 220 of the first pipe stage 204 change would yield a three-cycle overlapping window. A key feature of a pipe stage is that subsequent stages are allowed to change only on opposite phases, by virtue of swapping multiplexer input assignments on each latch. This provides the overlapping regions necessary to avoid reclock setup and hold violations under all timing conditions.

Some DDR-SDRAMS provide fractional CAS latencies (2.5, 3.5, etc.) to optimize system performance. Since a fractional CAS latency appears to the pipe as a half-cycle clock shift, the pipe accommodates this by inverting the phase variable via an XOR gate 230 that controls each multiplexer latch selector in the pipe.

In the receive stage 202, the strobes 110, 112 from FIG. 1 is used to latch data from data path 209. The data from the data path 209 is supplied to two receive latches. The data is first latched into the first receive latch 210 by the strobe 112 from the rising edge delay line. The next set of data from the data path 209 is latched into the second receive latch 212 by the strobe 110 from the falling edge delay line. As the second set of data is latched by the second receive latch 212, the first data is latched into a third receive latch 214 by the same strobe 110. At this point, the data from the data path 209 are converted into a doublewide data.

The data from the receiving stage 202 can either be latched by the first pipe stage 204 or pass through directly to the second pipe stage 206 depending on the setting of add half cycle signal 208. The add-half cycle signal 208 is controlled by software. When the add half cycle signal 208 is not set, the data pass through multiplexers 216 to the second pipe stage 206. If the add-half cycle signal 208 is set, the data is forced to pass through multiplexer-latches 220.

The data from the multiplexers 216 arrive to the second pipe stage 206 through multiplexer-latches 224. The data from the DDR-SDRAM generated by both rising edge and falling edge are recovered from the multiplexer-latches 224.

Figure 3:
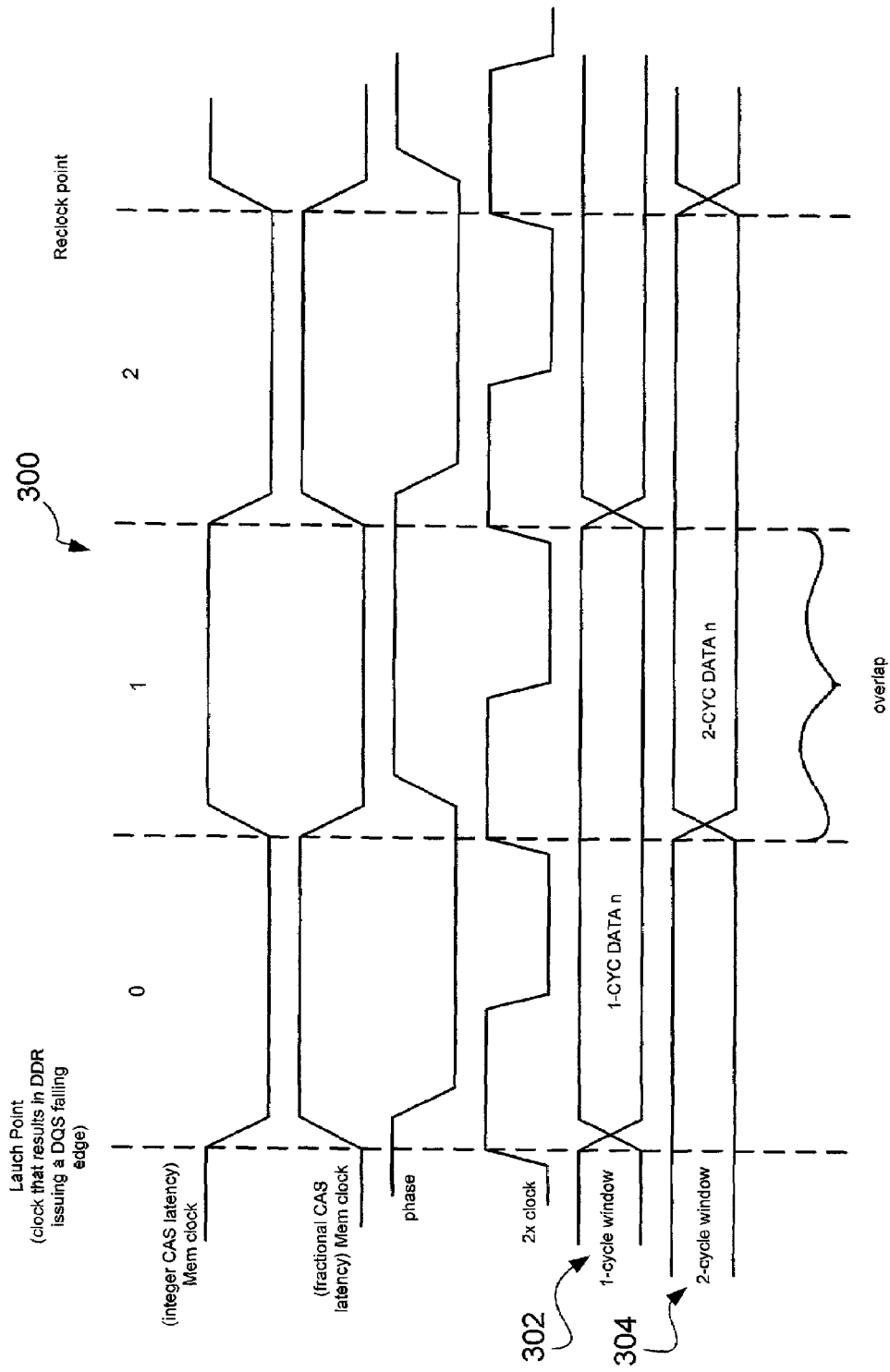
FIG. 3 illustrates a timing diagram for the circuit shown in FIG. 2.

FIG. 3 is timing diagram 300 illustrating the overlapping data windows. The "1-cycle window" 302 depicts the range of times in which data appearing at the output of the receive latches will be correctly sampled while in one-cycle mode. This situation would occur at slow clock rates and/or fast generation and/or propagation of data and strobes from the DDR, which implies that an additional 2X clock delay (via Add half cycle 208 in FIG. 2) in the pipe will be needed to guarantee that data comes out of the pipe on the clock cycle in which it is expected. The "2-cycle window" 304 depicts the range of times in which data appearing at the output of the receive latches will be correctly sampled while in two-cycle mode. This situation would occur at higher clock rates and/or with longer delay in the generation/propagation of data/strobe from DDR. By virtue of the overlap, setup or hold violations on the pipe stages are avoided by correct selection of 1-cycle or 2-cycle mode. The 2-cycle mode, in which the data/strobe propagation delay from the DDR is slow relative to the clock period and no additional delay is required, is selected when the first pipe stage 204 is by passed, and the 1-cycle mode, where the DDR data/strobe comes in fast enough relative to the clock to require the insertion of an additional 2×clock cycle of delay, is selected when the data pass through both the first pipe stage 204 and the second pipe stage 206.

While the invention has been particularly shown and described with reference to preferred embodiments thereof, it will be understood by those skilled in the art that various other changes in form and detail may be made without departing from the spirit and scope of the invention.

What is claimed is:

1. A system in a computing device for maximizing set up time and hold time for data reads from a double-data-rate (DDR) memory device, the system comprising:

a strobe timing adjustment circuit, the strobe timing adjustment circuit having at least one programmable delay unit, the at least one programmable delay unit being controlled by software; and a single-datum-to-double-data converting circuit, wherein timing of data from the converting circuit is controlled through an add-half cycle control, the add-half cycle control being activated through software;

wherein the strobe timing adjustment circuit adjusts timing of a strobe from the DDR memory device through the at least one programmable delay unit, and an adjusted strobe from the strobe timing adjustment circuit is used to latch data from the DDR memory device into said converting circuit.

2. The system according to claim 1, wherein the at least one programmable delay unit is adjusted through a series of read/write operations wherein a known pattern is written into a device, a pattern read back from the same device, and the read pattern compared with the known pattern such that the at least one programmable delay unit is adjustable during the read/write operations to produce an optimal result.

3. The system according to claim 1, wherein the activation of the add-half cycle control is determined through a series of read/write operations wherein a known pattern is written into a device, a pattern is read back from the same device, and compared with the known pattern and the add half cycle control is selectively activated during the read/write operations until the read/write operations produce an optimal result.

4. The system according to claim 1, wherein when the add-half cycle control is active, the system delays the data output by a half timing cycle.

5. The system according to claim 1, wherein a double-data-rate data from the DDR memory device is output as a single-data-rate data from the system.

6. The system according to claim 2, wherein the adjustment of the programmable delay unit is performed each time when the computing device is booted.

7. The system according to claim 2, wherein the adjustment of the programmable delay unit is performed periodically while the computing device is running.

8. The system according to claim 3, wherein the activation of the add-half cycle signal is determined each time when the computing device is booted.

9. The system according to claim 3, wherein the activation of the add half cycle signal is determined periodically while the computing device is running.

10. A method for maximizing set up time and hold time for data reads from a double-data-rate (DDR) memory device in a computing system, the method comprising the steps of:

generating a first strobe for rising edge latches and a second strobe for falling edge latches from a single strobe, wherein timing for the first strobe and the second strobe can be adjusted;

converting a single datum from the DDR memory device into a doublewide data, wherein the doublewide data are latched with the first strobe and the second strobe; and latching the doublewide data into a second pipe stage latch with 2X clock.

11. The method according to claim 10, wherein the converting step further comprises the steps of:

latching the first datum from the DDR memory device into a first receiving latch with the first strobe;

latching the second datum from the DDR memory device into a second receiving latch with the second strobe; and latching output from the first receiving latch into a third receiving latch with the second strobe.

12. The method according to claim 10 further comprising the step of:

latching the doublewide data into a first pipe stage latch before latching the doublewide data into a second pipe stage latch with 2X clock.

13. The method according to claim 12 further comprising the steps of:

selecting data between the doublewide data and output from the first pipe stage latch; and passing the selected data to the second pipe stage latch.

14. The method according to claim 13, wherein the selecting step depends upon an add-half cycle signal.

15. A system in a computing device for maximizing set up time and hold time for data reads from a double-data-rate (DDR) memory device, the system comprising:

strobe signal means for generating a first strobe and a second strobe from a single strobe;

timing means for adjusting timing of the first strobe and the second strobe;

conversion means for converting a single datum received from a DDR memory device into a doublewide data, wherein the doublewide data are latched with the second strobe; and delay means for adding a half-cycle delay to the doublewide data.

16. The system according to claim 15, wherein the delay means further comprises a path selection means for selecting data to pass to an output latch.

* * * * *

UNITED STATES PATENT AND TRADEMARK OFFICE
CERTIFICATE OF CORRECTION

PATENT NO. : 6,950,350 B1
DATED : September 27, 2005
INVENTOR(S) : Daniel L. Kerl It is certified that error appears in the above-identified patent and that said Letters Patent is hereby corrected as shown below:

Title page,
Item [73], Assignee, change "#DLABS, Inc." to "3DLABS, Inc.".

Signed and Sealed this

Third Day of January, 2006

JON W. DUDAS
*Director of the United States Patent and Trademark Office*